(12) United States Patent
Fan et al.

(10) Patent No.: US 10,475,637 B2
(45) Date of Patent: Nov. 12, 2019

(54) SEMICONDUCTOR SUBSTRATE AND MANUFACTURING METHOD THEREOF

(71) Applicant: GlobalWafers Co., Ltd., Hsinchu (TW)

(72) Inventors: Chun-I Fan, Hsinchu (TW);
Chih-Yuan Chuang, Hsinchu (TW);
Ying-Ru Shih, Hsinchu (TW);
Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/586,291

(22) Filed: May 4, 2017

(65) Prior Publication Data
US 2018/0019115 A1    Jan. 18, 2018

(30) Foreign Application Priority Data

Jul. 13, 2016 (TW) .............................. 105122010 A
Jan. 12, 2017 (TW) .............................. 106100952 A

(51) Int. Cl.
| H01L 21/00 | (2006.01) |
| H01L 21/02 | (2006.01) |
| H01L 21/265 | (2006.01) |
| H01L 21/324 | (2006.01) |
| H01L 29/32 | (2006.01) |

(52) U.S. Cl.
CPC ...... *H01L 21/02021* (2013.01); *H01L 21/265* (2013.01); *H01L 21/324* (2013.01); *H01L 29/32* (2013.01)

(58) Field of Classification Search
None
See application file for complete search history.

(56) References Cited

U.S. PATENT DOCUMENTS

| 5,066,359 A * | 11/1991 | Chiou ................. H01L 21/3221 148/33 |
| 5,212,394 A | 5/1993 | Iwasaki et al. |
| 9,006,865 B2 | 4/2015 | Ikuta et al. |
| 2001/0039119 A1* | 11/2001 | Kishimoto ........ H01L 21/02008 438/690 |
| 2006/0226557 A1* | 10/2006 | Yamamoto .......... H01L 21/3221 257/794 |
| 2008/0217784 A1* | 9/2008 | Binder .................. H01L 21/486 257/762 |
| 2009/0194162 A1* | 8/2009 | Sivaram .......... H01L 31/022425 136/258 |

(Continued)

FOREIGN PATENT DOCUMENTS

| CN | 102978695 | 3/2013 |
| CN | 103746051 | 4/2014 |

(Continued)

OTHER PUBLICATIONS

"Office Action of Taiwan Counterpart Application," dated May 2, 2017, p. 1-p. 6, in which the listed references were cited.

*Primary Examiner* — Reema Patel
(74) *Attorney, Agent, or Firm* — JCIPRNET

(57) ABSTRACT

A semiconductor substrate and a manufacturing method thereof are provided. The semiconductor substrate has an epitaxy region located at a central portion of a main plane of the semiconductor substrate, a periphery region surrounding the epitaxy region and an injured region distributed inside the periphery region.

4 Claims, 5 Drawing Sheets

(56) References Cited

U.S. PATENT DOCUMENTS

| | | | |
|---|---|---|---|
| 2010/0270649 A1* | 10/2010 | Ishibashi | C30B 29/403 257/615 |
| 2011/0086492 A1* | 4/2011 | Ohnuma | H01L 21/02024 438/455 |
| 2011/0241022 A1* | 10/2011 | Masuda | G01V 8/12 257/77 |
| 2013/0140567 A1 | 6/2013 | Kim et al. | |
| 2014/0187022 A1* | 7/2014 | Falster | H01L 21/302 438/476 |
| 2016/0149011 A1* | 5/2016 | Hu | H01L 29/45 257/741 |

FOREIGN PATENT DOCUMENTS

| | | |
|---|---|---|
| JP | 2007258230 | 10/2007 |
| JP | 2012151402 | 8/2012 |
| TW | 392349 | 6/2000 |
| TW | 201121096 | 6/2011 |

* cited by examiner

SEMICONDUCTOR SUBSTRATE AND MANUFACTURING METHOD THEREOF

CROSS-REFERENCE TO RELATED APPLICATION

This application claims the priority benefits of Taiwan application serial no. 105122010, filed on Jul. 13, 2016, and Taiwan application serial no. 106100952, filed on Jan. 12, 2017. The entirety of each of the above-mentioned patent applications is hereby incorporated by reference herein and made a part of this specification.

BACKGROUND

Field of the Invention

The invention is directed to a substrate and a manufacturing method thereof and more particularly, to a semiconductor substrate and a manufacturing method thereof.

Description of Related Art

In an epitaxial process performed on a heterogeneous substrate, defects may occur due to material property differences. For example, during a epitaxial process of a III nitride semiconductor material performed on a Si-substrate, epitaxial defects, for example, dislocation, cracks and so on, may occur to an epitaxy layer due to a great stress caused by lattice mismatch and a difference of thermal expansion coefficients, which influences epitaxial quality and is unfavorable for device properties. Moreover, the difference of thermal expansion coefficients would result in stress accumulation and cause the cracks to occur to an epitaxial film due to a shrinkage difference between the substrate and the epitaxy layer when the epitaxy stops from growing and is cooled down.

When more stress is accumulated at the structure, the defects caused by the stress may extend upward to influence flatness of the epitaxy layer, or extend downward to induce plastic deformation of the substrate. Different locations influenced by the stress cause the defects to generate at different locations. For example, the cracks are generated on the epitaxy layer as a surface of the epitaxy layer is influenced by the stress, while slip lines are defects occurring in the substrate because the substrate is deformed by the stress, which results in the occurrence of dislocation or shift on a crystalline plane.

At present, most conventional methods attempt to mitigate the stress accumulation by interposing different material layers between the epitaxy layer and the substrate. For example, in Japanese Patent Publication No. JP 2007-258230A, a multi-layer buffer layer composed of AlGaInN is interposed on a silicon single-crystal substrate (111), thereby adjusting the lattice mismatch and other stress issues in heterogeneous epitaxy and preventing the occurrence of defects on an epitaxy layer surface. In addition, for example, in Japanese Patent Publication No. JP 2012-151402A, a GaN epitaxy process is performed after a surface with an irregular concave-convex roughness layer is additionally provided on an epitaxial surface of a Si-substrate, thereby suppressing the occurrence of defects, such as warpages, cracks or the like during the epitaxial process to enhance epitaxial quality.

However, the aforementioned conventional methods can only improve the defects occurring to the epitaxy layer, but cannot effectively suppress the defects occurring to the substrate, and the methods disclosed by the related art only disclose forming a stress-relief structure region through an additionally designed buffer layer on the substrate surface or a buffer with a specially processed layer. Actually, as different locations influenced by the stress cause the defects to generate at different locations, the defects may be generated on the epitaxy layer surface or in the substrate, extend from the substrate and influence the epitaxy layer. Typically, the conventional methods as described above usually compensate the coefficient differences by the buffer layer, or dispose a special structure on a substrate surface with the buffer layer, thereby forming the stress-relief structure region. Nevertheless, these methods can only suppress the defects from occurring on the surface of the epitaxy layer surface, but cannot suppress the defects or other substrate issues from occurring in the substrate and extending to the epitaxy layer or the epitaxial main plane. Therefore, as the defects occurring in the substrate cannot be effectively suppressed, the defects may extend toward the epitaxial main plane and further influence the crystal arrangement of the epitaxy layer, which results in reduced quality of the epitaxy layer and is unfavorable for device functions.

SUMMARY

In order to solve the aforementioned issues, the invention provides a semiconductor substrate and a manufacturing method thereof.

According to one of the embodiments of the invention, a semiconductor substrate including an epitaxy region, a periphery region surrounding the epitaxy region and an injured region distributed inside the periphery region is provided. The epitaxy region is located at a central portion of a main plane of the semiconductor substrate.

A semiconductor substrate provided by the invention includes an epitaxy region and a periphery region surrounding the epitaxy region is provided. The epitaxy region is at a central portion of the substrate, and a mirror surface finishing process is performed on a surface of the epitaxy region. The periphery region surrounds the epitaxy region, the periphery region is manufactured by, but not limited to, a grinding method, so as to form an injured region inside the periphery region.

The injured region is a lattice strain region formed inside the substrate. The so-called lattice strain region refers to a region where the lattice arrangement is distorted, and is a specific region formed by lattices arranged in a variety of distorted directions. Therefore, the injured region is actually a tiny lattice strain region that cannot be observed by eyes, and as the deformation caused by the lattice distortion occurs inside the substrate, no specific structure, e.g., a roughness structure, is generated on the substrate surface. The structure of the injured region of the invention facilitates concentrating and releasing the stress in this region through the lattices pulling one another in the distortion directions, thereby effectively suppressing the extension of defects. In an embodiment of the invention, the main plane of the semiconductor substrate is surrounded by a bevel portion which is manufactured by a deformation process, and the bevel portion is located in the periphery region.

In an embodiment of the invention, the injured region is etched by a specific chemical etching method, thereby measuring a depth of the injured region, where the depth is at least more than 3 micrometers ($\mu m$).

A manufacturing method of a semiconductor substrate of the invention includes: providing a semiconductor substrate, and forming an injured region inside a periphery region of the semiconductor substrate.

According to another embodiment of the invention, the semiconductor substrate may be any substrate, including, but not limited to, a sapphire substrate, a SiC-substrate, a GaN-substrate or a Si-substrate.

In the invention, defects (especially including, but not limited to, slip lines) can be suppressed from generating in the substrate by manufacturing the injured region inside the periphery region of the plane of the semiconductor substrate. Thereby, the epitaxial quality of the III party nitride semiconductor material can be improved.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
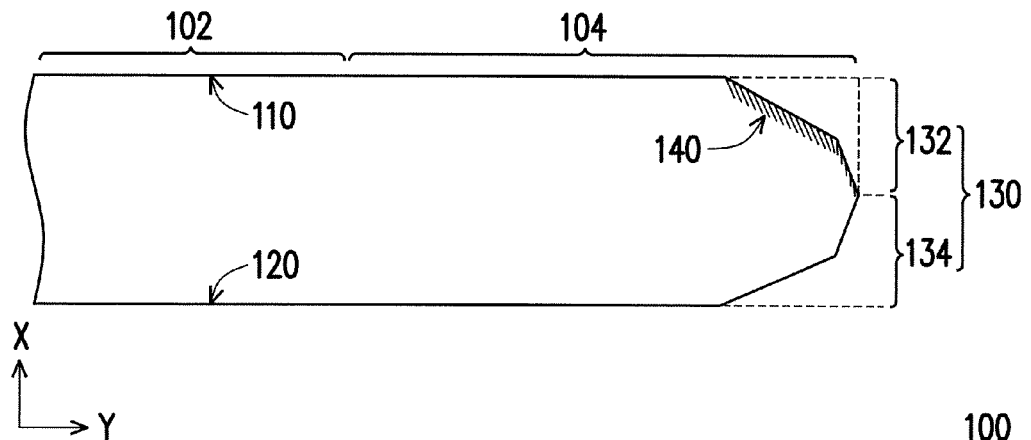
FIG. 1 is a schematic partial cross-sectional view illustrating a semiconductor substrate according to an embodiment of the invention.

FIG. 1 is a schematic partial cross-sectional view illustrating a semiconductor substrate according to an embodiment of the invention. Referring to FIG. 1, a semiconductor substrate 100 of the present embodiment includes an epitaxy region 102, a periphery region 104 and an injured region 140. The epitaxy region 102 is located at a central portion of a main plane 110 of the semiconductor substrate 100, the periphery region 104 surrounds the epitaxy region 102, and the injured region 140 is distributed inside the periphery region 104. In another aspect, the semiconductor substrate 100 has the main plane 110, a back surface 120 and a bevel portion 130. The main plane 110 is opposite to the back surface 120, the bevel portion 130 is connected between the main plane 110 and the back surface 120, and the bevel portion 130 is not parallel to the main plane 110. Taking the orientation shown in FIG. 1 for example, the main plane 110 is a plane facing toward a positive X-direction, the back surface 120 is opposite to the main plane 110, thus, the back surface 120 faces toward a negative X-direction, and the bevel portion 130 is connected between the main plane 110 and the back surface 120, i.e., other surfaces of the semiconductor substrate 100 which belong to neither the main plane 110 nor the back surface 120 belong to the bevel portion 130. The bevel portion 130 is substantially a ring-shaped side surface located at an edge of the semiconductor substrate 100.

Figure 2A:
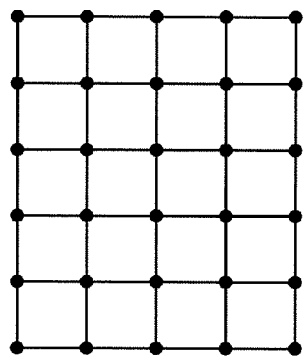
FIG. 2A and FIG. 2B are schematic views respectively illustrating lattice arrangements in a normal region and an injured region of the semiconductor substrate.
Figure 2B:
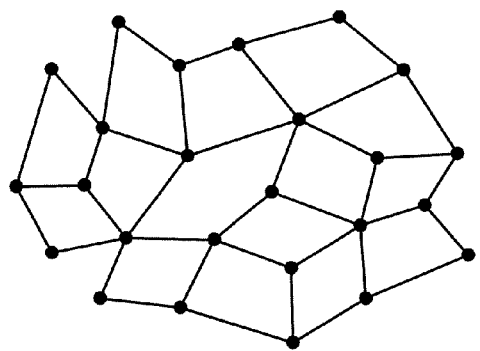
Figure 3:
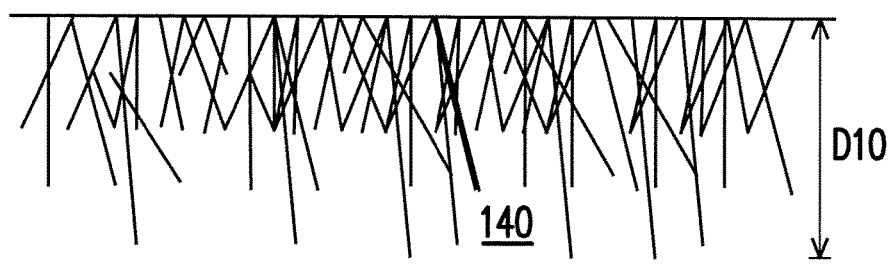
FIG. 3 is a schematic partial enlarged view of the etched injured region of the semiconductor substrate depicted in FIG. 1.
Figure 4:
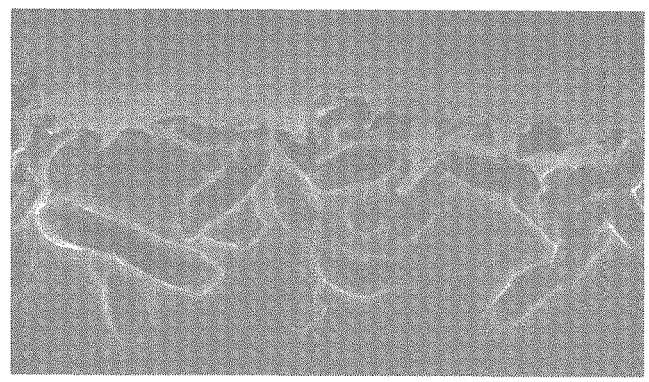
FIG. 4 is a picture of a cross-sectional view of the etched injured region.

The injured region 140 as mentioned in the invention is a lattice strain region which is incapable of being observed by eyes. A normal lattice arrangement is as illustrated in FIG. 2A, which is formed by stacking lattices in a single periodic arrangement, and a lattice arrangement of the injured region 140 is as illustrated in FIG. 2B, which is formed by stacking lattices in various lattice arrangement directions. In the invention, the lattices are distorted by being processed outside the substrate, thereby forming a group of regions with a variety of lattice arrangement directions. As this place is an internal injured structure formed inside the substrate by lattices arranged in different directions, no visible external injured structure is formed outside the substrate, as well as the internal injured structure formed inside the substrate facilitates concentrating stress in this region, so as to achieve an effect of suppressing defects. As described above, the structure of the injured region set forth in the invention is an invisible lattice distortion region. In order to locate and measure a depth of the injured region, the injured region of the substrate is first cut open and ground to smooth the section, and then etched by a selective etching method, for example (but not limited to), a Wright etching method, thereby enlarging the injured region and measuring the depth of the injured region. For example, FIG. 3 is a schematic view of the injured region after being etched, and FIG. 4 is a picture of a cross-sectional view of the etched injured region.

In an embodiment of the invention, the semiconductor substrate 100 having the injured region structure is provided, and with the injured region structure formed inside the substrate, the stress occurring to the substrate may be effectively concentrated in this region for being released, thereby preventing slip defects generating at the substrate from extending to the epitaxy region. Certainly, the injured region 140 may also achieve effects of guiding and suppressing defects of other types. The injured region of the invention is defined by a depth distribution range D10 (which is labeled in FIG. 3) inside the substrate, and a depth of the injured region formed within a specific range is proportional to an effect of suppressing the slip lines. In other words, the depth distribution range D10 of the injured region 140 extends downward from a surface (i.e., the main plane 110) of the semiconductor substrate 100 to more than 3 micrometers (µm). Referring to Table 1 below, which is obtained by performing an experiment on a 6-inch substrate with a crystal orientation (111) and a thickness of 1000±10 µm used as an example, a method of forming the injured region is a grinding process using a grinding wheel of wheel No. #800 or #3000, for example. According to Table 1, lengths of slip lines of an epitaxy layer are about 2.6 mm when the depth distribution range of the injured region is 0 µm, the lengths of the slip lines of the epitaxy layer are about 2.5 mm when the depth distribution range of the injured region is 3 µm to 5 µm, the lengths of the slip lines of the epitaxy layer are about 1.5 mm when the depth distribution range of the injured region is 15 µm to 20 µm, the lengths of the slip lines of the epitaxy layer are about 1.3 mm when the depth distribution range of the injured region is 23 μm to 30 μm, and the lengths of the slip lines of the epitaxy layer are about 1.2 mm when the depth distribution range of the injured region is 35 μm to 45 μm. The injured region formed inside the periphery region of the substrate may achieve the effect of suppressing the slip lines as long as the depth distribution range D10 thereof is at least more than 3 μm, while the depth distribution range D10 of the injured region may be 15 μm to 45 or 15 μm to 30 μm. In addition, the depth range of the injured region of the invention is preferably 15 μm to 20 μm and 23 μm to 30 μm. Namely, an average depth of the injured region is preferably 17.5 μm to 26.5 μm (where values of the range are calculated by (15+20)/2=17.5 μm and (23+30)/2=26.5 μm).

TABLE 1

| Depth Distribution Range of Injured Region (μm) | Length of Slip Lines of Epitaxial Layer (mm) |
|---|---|
| 0 | 2.6 |
| 3 to 5 | 2.5 |
| 15 to 20 | 1.5 |
| 23 to 30 | 1.3 |
| 35 to 45 | 1.2 |

The bevel portion 130 and the main plane 110 of the semiconductor substrate 100 of the present embodiment are made of the same material. The main plane 110 is, for example, parallel to the back surface 120 in the present embodiment. In the present embodiment, the main plane 110 of the semiconductor substrate 100 is surrounded by the bevel portion 130 which is manufactured by a deformation process. The bevel portion 130 may also be referred to as a chamfer region. The bevel portion 130 is located in the periphery region 104. The bevel portion 130 of the present embodiment may be divided into, for example, an upper side surface 132 close to the main plane 110 and a lower side surface 134 close to the back surface 120. The upper side surface 132 is visible by viewing the semiconductor substrate 100 along the X-direction from the top of the main plane 110, while the lower side surface 134 is visible by viewing along the X-direction from the bottom of the back surface 120. The injured region 140 is located at the upper side surface 132 in the present embodiment, namely, the injured region 140 is located inside an upper portion of the bevel portion 130.

Figure 5:
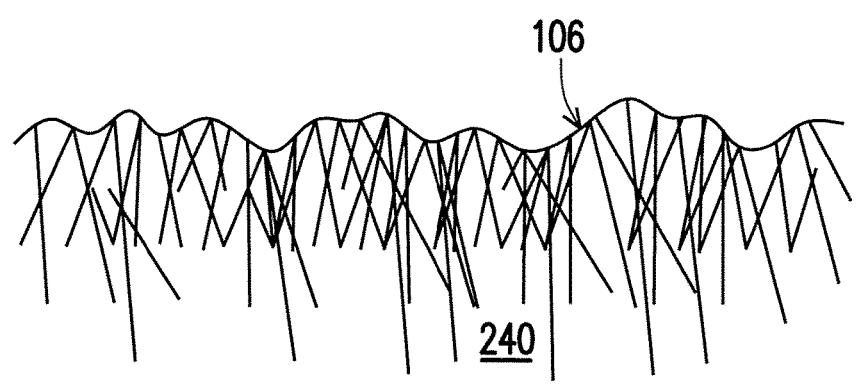
FIG. 5 is a schematic partial enlarged view of an injured region of a semiconductor substrate according to another embodiment of the invention.

FIG. 5 is a schematic partial enlarged view of an injured region semiconductor substrate of a semiconductor substrate according to another embodiment of the invention. Referring to FIG. 5, in the present embodiment, the periphery region 104 depicted in FIG. 1 may further include a rough region 106. The rough region 106 and the injured region 140 are different from each other, but distributed regions thereof may be partially or entirely overlap. The rough region 106 refers to a surface thereof having concave-convex roughness, namely, regular or irregular external injured structures are formed thereon.

Figure 6:
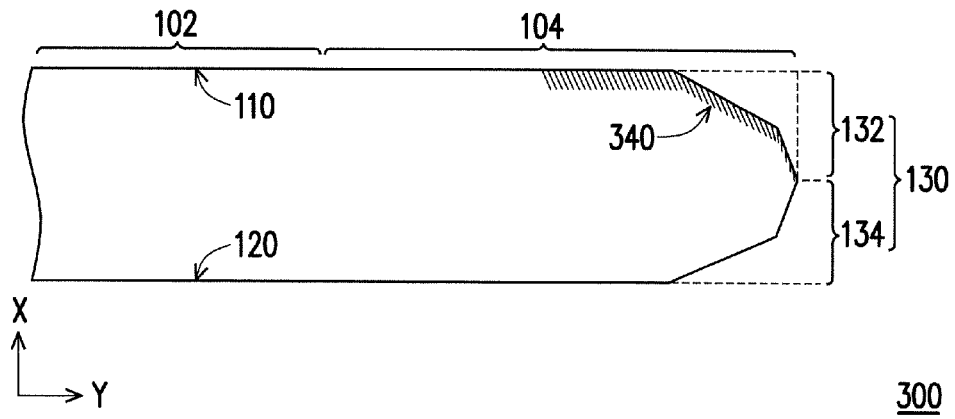
FIG. 6 and FIG. 7 are schematic partial cross-sectional views illustrating semiconductor substrates according to other two embodiments of the invention.
Figure 7:
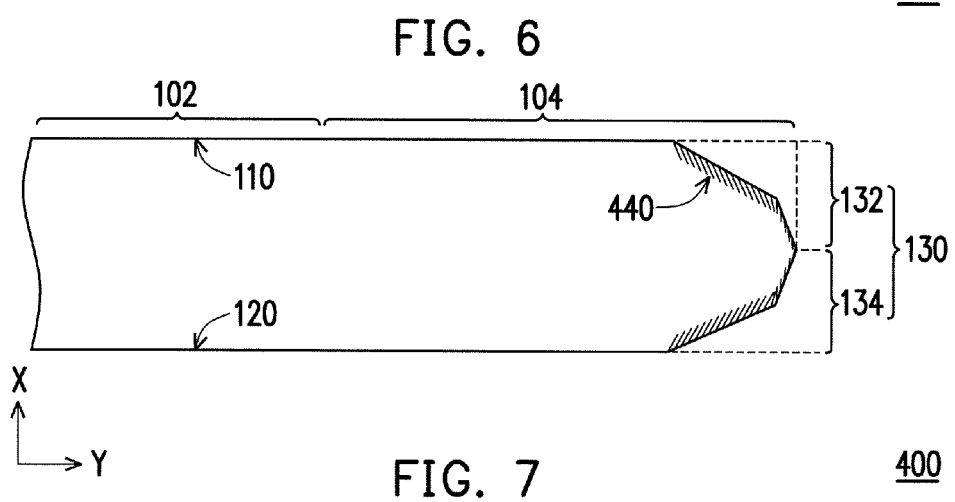

Referring to FIG. 6 illustrating another embodiment of the invention, a semiconductor substrate 300 of the present embodiment is substantially the same as the semiconductor substrate 100 depicted in FIG. 1, where an injured region of the semiconductor substrate 300 may be distributed inside the periphery region 104 in addition to the bevel portion 130. Additionally, referring to FIG. 7, a semiconductor substrate 400 of the present embodiment is also substantially the same as the semiconductor substrate 100 depicted in FIG. 1, and the difference is that an injured region 440 of the semiconductor substrate 400 located at not only the upper side surface 132 of the bevel portion 130, but also at the lower side surface 134 of the bevel portion 130.

Figure 8:
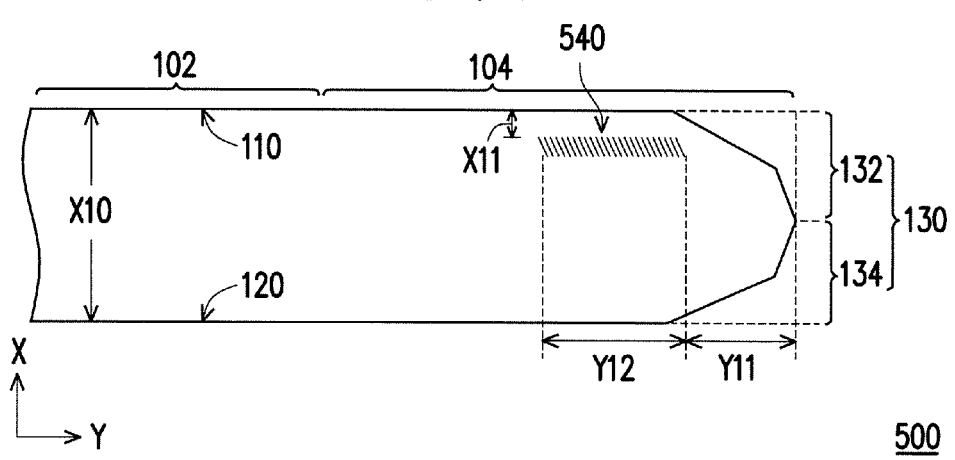
FIG. 8 is a schematic partial cross-sectional view illustrating a semiconductor substrate according to another embodiment of the invention.

FIG. 8 is a schematic partial cross-sectional view illustrating a semiconductor substrate according to another embodiment of the invention. Referring to FIG. 8, a semiconductor substrate 500 of the present embodiment is substantially the same as the semiconductor substrate 100 depicted in FIG. 1, and the same parts will not be repeatedly described hereinafter. The difference between the two embodiments is that an injured region 540 of the present embodiment may be distributed inside the semiconductor substrate 500 and at a place relatively far away from a surface of the semiconductor substrate 500. For example, a distance X11 is between the injured region 540 and the surface of the semiconductor substrate 500, and the distance X11 is for example, more than 2 μm. In other words, a depth distribution range of the injured region 540 extends downward from a place at a distance more than 2 μm from the surface (i.e., the main plane 110) of the semiconductor substrate 500. Moreover, the injured region 540 is located inside the semiconductor substrate 500 and at a place relatively far away from an outer edge of the semiconductor substrate 500. For example, a distance Y11 between the injured region 540 and the outer edge of the semiconductor substrate 500. Thus, the injured region 540 is located inside the semiconductor substrate 500 and is an internal injured structure which is incapable of being observed by eyes, and there are no defects on the appearance of the semiconductor substrate 500. In an embodiment of the invention, the semiconductor substrate 500 has a thickness X10, where X10 is more than the distance X11 between the injured region 540 and the surface of the semiconductor substrate 500 which is more than 2 μm. In another embodiment of the invention, the distance X11 between the injured region 540 and the surface of the semiconductor substrate 500 is more than 3 μm. In yet another embodiment of the invention, the distance Y11 between the injured region 540 and the outer edge of the semiconductor substrate 500 is less than or equal to 3 mm. By viewing from the top of the semiconductor substrate 500, the injured region 540 of the present embodiment may be strip-shaped, and the strip-shaped injured region 540 may have a width Y12, where the width Y12 is less than 100 μm.

Figure 9:
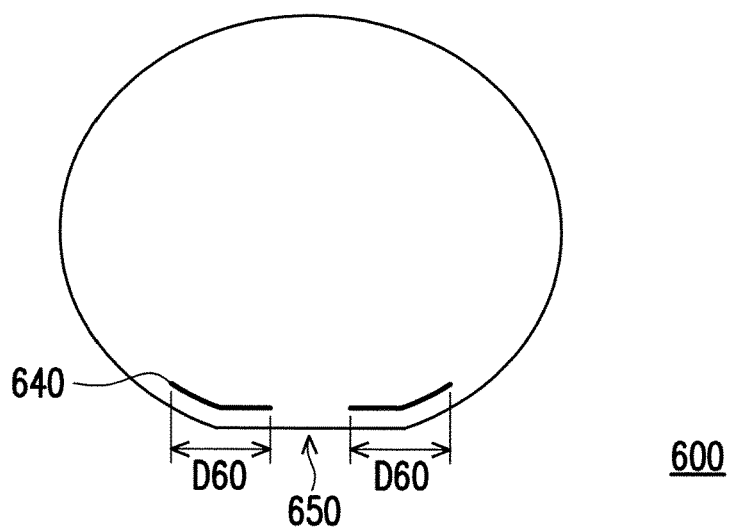
FIG. 9 to FIG. 11 are schematic top views of semiconductor substrates according to other three embodiments of the invention.
Figure 10:
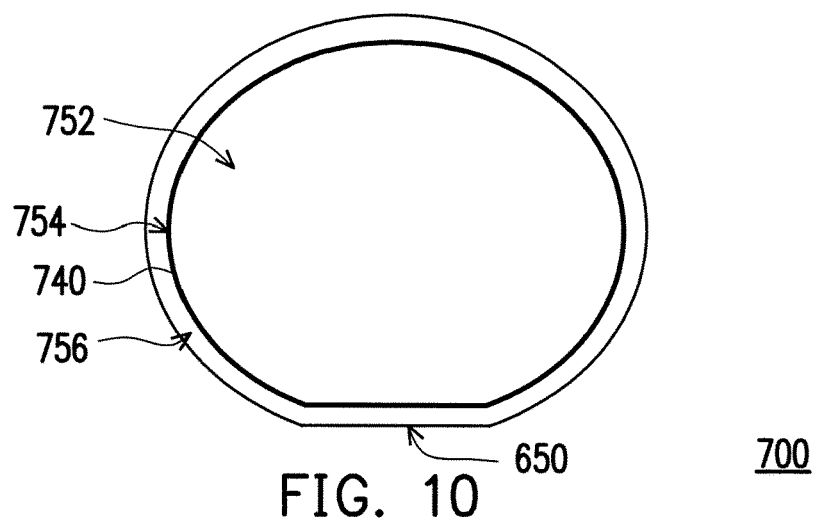
Figure 11:
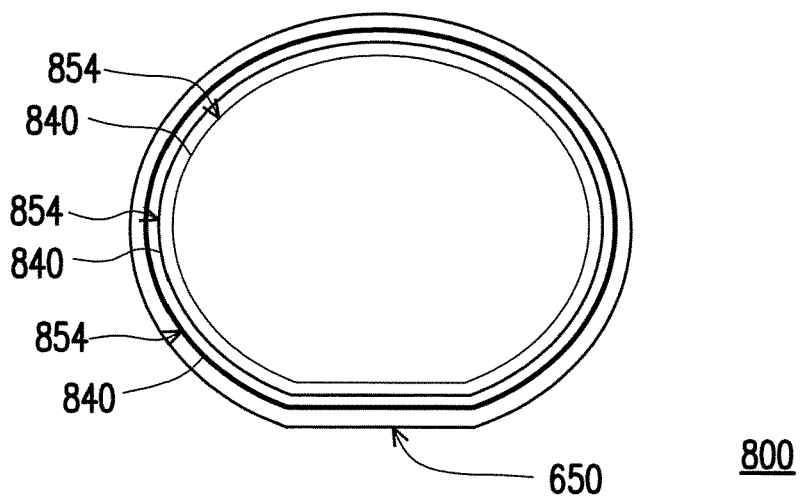

FIG. 9 to FIG. 11 are schematic top views of semiconductor substrates according to other three embodiments of the invention. In FIG. 9 to FIG. 11, though positions of injured regions seem to be visible, the injured region may actually be hidden under semiconductor substrates, while the positions are shown in the figures only for descriptive convenience. Referring to FIG. 9, in the present embodiment, an outer edge of a semiconductor substrate 600 has a flat edge 650, an injured region 640 is at least close to two corners of the flat edge 650. In the present embodiment, the injured region 640 includes two parts which are respectively close to the two corners of the flat edge 650 and separated from each other. A length D60 of each of the two separated parts of the injured region 640 is, for example, more than 2 cm. The two separated parts of the injured region 640 may be symmetric to each other, but the invention is not limited thereto. In other embodiments, the injured region may also present a single continuous strip-shaped distribution and cover the two parts close to the two corners of the flat edge, but the invention is not limited thereto. By performing an experiment on the 6-inch substrate with the crystal orientation (111) and the thickness of 1000±10 μm used as an example, with reference to FIG. 8 and FIG. 9, a distance between the injured region 640 and a surface of the semiconductor substrate 600 (which is similar to the distance X11 in FIG. 8) is 2 μm to 20 μm, a width of the injured region 640 (which is similar to the width Y12 in FIG. 8) is 65 μm to 85 μm, a distance between the injured region 640 and an outer edge of the semiconductor substrate 600 (which is similar to the distance Y11 in FIG. 8) is 0.3 mm to 0.7 mm, the length D60 of each of the two separated parts of the injured region 640 is 50 mm to 70 mm, and in this case, lengths of slip lines in an epitaxy layer are limited to about 1.5 mm.

Referring to FIG. 10, a semiconductor substrate 700 of the present embodiment is substantially the same as the semiconductor substrate 600 in FIG. 9, and the difference is in that an injured region 740 presents a ring shape. For example, the injured region 740 may be a closed single-ring shape. Generally, the overall semiconductor substrate 700 presents a single-crystalline state after an epitaxy process and being cut into pieces, and before a follow-up process is performed; however, the injured region 740 of the present embodiment may also be in a non-single crystalline state. Thus, in the present embodiment, the semiconductor substrate 700 may be divided into an inner single-crystalline region 752, a non-single crystalline region 754 and an outer single-crystalline region 756 by the injured region 740, and so the injured region 740 constitutes the non-single crystalline region 754. By performing an experiment on the 6-inch substrate with the crystal orientation (111) and the thickness of 1000±10 μm used as an example, with reference to FIG. 8 and FIG. 10, a distance between the injured region 740 and a surface of the semiconductor substrate 700 (which is similar to the distance X11 in FIG. 8) is 180 μm to 200 μm, a width of the injured region 740 (which is similar to the width Y12 in FIG. 8) is 65 μm to 85 μm, a distance between the injured region 740 and an outer edge of the semiconductor substrate 700 (which is similar to the distance Y11 in FIG. 8) is 0.3 mm to 0.7 mm, and in this case, lengths of slip lines in an epitaxy layer are limited to about 1.5 mm.

Referring to FIG. 11, a semiconductor substrate 800 of the present embodiment is substantially the same as the semiconductor substrate 700 in FIG. 10, and the difference is that a non-single crystalline region 854 of the semiconductor substrate 800 presents a multi-ring shape. Thus, an injured region 840 constituting the non-single crystalline region 854 in this way also presents a multi-ring shape. Each ring of the injured region 840 may have the same depth or different depths, and an interval between each neighboring rings may be the same or different. With these designs, the effect of suppressing defects may be further enhanced. By performing an experiment on the 6-inch substrate with the crystal orientation (111) and the thickness of 1000±10 μm used as an example, with reference to FIG. 8 and FIG. 11, the injured region 840 adopts a two-ring design, a distance between the two rings of the injured region 840 and a surface of the semiconductor substrate 800 (which is similar to the distance X11 in FIG. 8) is 180 μm to 200 μm, a width of each ring of the injured region 840 (which is similar to the width Y12 in FIG. 8) is 65 μm to 85 μm, distances between the two rings of the injured region 840 and an outer edge of the semiconductor substrate 800 (which is similar to the distance Y11 in FIG. 8) are respectively less than 0.7 mm and 1 mm, and in this case, lengths of slip lines in an epitaxy layer are limited to about 1.4 mm.

Figure 12:
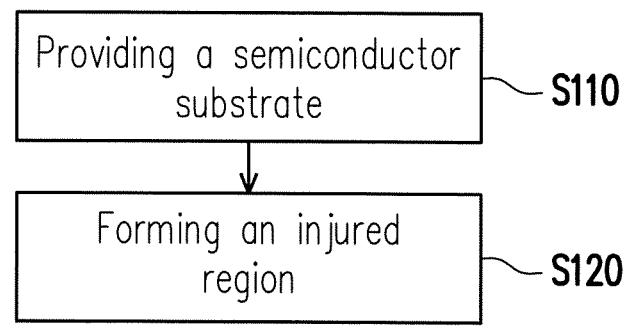
FIG. 12 is a flowchart of a manufacturing method of a semiconductor substrate according to an embodiment of the invention.

FIG. 12 is a flowchart of a manufacturing method of a semiconductor substrate according to an embodiment of the invention. Referring to FIG. 1 and FIG. 12, the manufacturing method of the semiconductor substrate includes the following steps. First, a semiconductor substrate 100 is provided in step S110. The semiconductor substrate 100 of the present embodiment is substantially the same as the semiconductor substrate 100 depicted in FIG. 1. Then, the injured region 140 is formed inside the periphery region 104 of the semiconductor substrate 100 in step S120.

Step S120 of forming the injured region 140 inside the periphery region 104 may include, but not limited to, performing a sandblasting process, an ion implantation process, a grinding process, a laser irradiation process or any other process suitable for forming an internal injured structure of a lattice strain on the bevel portion 130. Taking the sandblasting process for example, but not limited thereto, the sandblasting process may be simultaneously performed on the main plane 110 and the bevel portion 130, and the main plane 110 is further subsequently polished, without polishing the bevel portion 130, so as to reserve the injured region 140 formed by the sandblasting process on the bevel portion 130. According to a result of the experiment performed by the applicant, when the injured region has a deep depth, lengths of subsequently grown slip lines are short, namely, the slip lines extend in a small amount toward the central portion of the main plane 110. Taking the grinding process for example, a grinding wheel of, for example, wheel No. #800 or #3000, may be used. In a case that the grinding wheel of wheel No. #3000 is used as an example, a depth of the injured region formed thereby is about 3 μm to 5 μm, and in a case that the grinding wheel of wheel No. #800 is used as an example, a depth of the injured region formed thereby is about 15 μm to 20 μm.

In another embodiment of the invention, step S120 of forming the injured region 540 inside the periphery region 104 may include, but not limited to, performing a stealth laser process, an ion implantation process or any other process suitable for forming an internal injured structure of a lattice strain on the semiconductor substrate 500, which is a simple process and may facilitate cost reduction. In the present embodiment, taking the stealth laser process for example, but not limited thereto, the stealth laser process may focus on the internal of the semiconductor substrate 500 to induce a qualitative change therein. The internal of the semiconductor substrate 500 where the stealth laser process is performed is qualitatively changed from a single-crystalline state to a non-single crystalline state, and the non-single crystalline may be amorphous, polycrystalline or microcrystalline, but the invention is not limited thereto.

In another embodiment of the invention, when the ion implantation is performed in step S120 of forming the injured region 540, the semiconductor substrate 500 may be heated after the ion implantation process is performed. In addition, after the injured region 540 is formed, follow-up processes may be performed to form various material layers on the semiconductor substrate 500, so as to form various devices. In other words, the injured region 540 in the present embodiment is formed before the semiconductor substrate 500 is used to manufacture various devices, which aims at preventing all kinds of defects from generating in follow-up processes.

In light of the foregoing, in the semiconductor substrate and the manufacturing method thereof provided by the invention, due to the presence of the injured region inside the periphery region, an epitaxial stress, a thermal stress or other stress that may cause damages can be guided to the periphery region and released when devices are subsequently manufactured on the semiconductor substrate, while the slip lines or defects in other forms can also be guided to grow in the direction toward the periphery region. In this way, defects can be prevented from existing in a final product formed on the main plane, thereby, improving the yield of the follow-up processes, e.g., epitaxial growth or other processes.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor substrate, comprising:
an epitaxy region, located at a central portion of a main plane of the semiconductor substrate;
a periphery region, surrounding the epitaxy region; and
an injured region, distributed inside the periphery region;
wherein the semiconductor substrate is a Si-substrate, an average depth of the injured region is from 17.5 µm to 26.5 µm, and the injured region is a lattice strain region, and
wherein the main plane of the semiconductor substrate is surrounded by a bevel portion which is manufactured by a deformation process, the bevel portion is located in the periphery region, and the injured region is located in the bevel portion.

2. The semiconductor substrate as recited in claim 1, wherein the injured region is located in an upper portion of the bevel portion.

3. The semiconductor substrate as recited in any one of claim 1, wherein the periphery region comprises a rough region.

4. A manufacturing method of a semiconductor substrate, comprising:
providing a semiconductor substrate; and
forming an injured region inside a periphery region of the semiconductor substrate, wherein an average depth of the injured region is from 17.5 µm to 26.5 µm and the injured region is a lattice strain region, wherein a bevel portion manufactured by a deformation process is located in the periphery region, and the injured region is located in the bevel portion, and the step of forming the injured region comprises:
performing a sandblasting process or a stealth laser process to form the injured region inside the periphery region.

* * * * *